United States Patent [19]

Mio

[11] Patent Number: 5,732,090
[45] Date of Patent: Mar. 24, 1998

[54] EDGE DETECTION CIRCUIT FOR DETECTING EDGE OF INPUT SIGNAL WITHOUT ERRONEOUS DETECTION

[75] Inventor: Yuichiro Mio, Tokyo, Japan

[73] Assignee: NEC Corporation, Tokyo, Japan

[21] Appl. No.: 723,960

[22] Filed: Sep. 26, 1996

[30] Foreign Application Priority Data

Sep. 28, 1995 [JP] Japan ............................ 7-251552

[51] Int. Cl.⁶ ........................................ H03M 13/00
[52] U.S. Cl. ................................................... 371/6
[58] Field of Search ................. 371/6, 48.1, 37.4; 375/359

[56] References Cited

U.S. PATENT DOCUMENTS 5,446,765 8/1995 Leger .......................... 375/259

FOREIGN PATENT DOCUMENTS 63-37710 2/1988 Japan .

*Primary Examiner*—Phung Chung
*Attorney, Agent, or Firm*—Young & Thompson

[57] ABSTRACT

A edge detection circuit has a D-type Flip Flop (D-FF) 11 having a reset node and an input node connected to an input terminal, a D-FF 12 connected to the D-FF 11, D-FF 13 having a set node and connected to the D-FF 12, D-FF 14 having set node and connected to the D-FF 13, a detection circuit 21, 22 for detecting an edge change of a control signal and output a detection signal when the control signal changes an inactive level (Hi level) to an active level (Lo level), and a control circuit 31, 51 for generating a set signal for set the D-FFs 13 and 14 when the control circuit receives the detection signal and the input signal IN indicates Hi level.

4 Claims, 6 Drawing Sheets

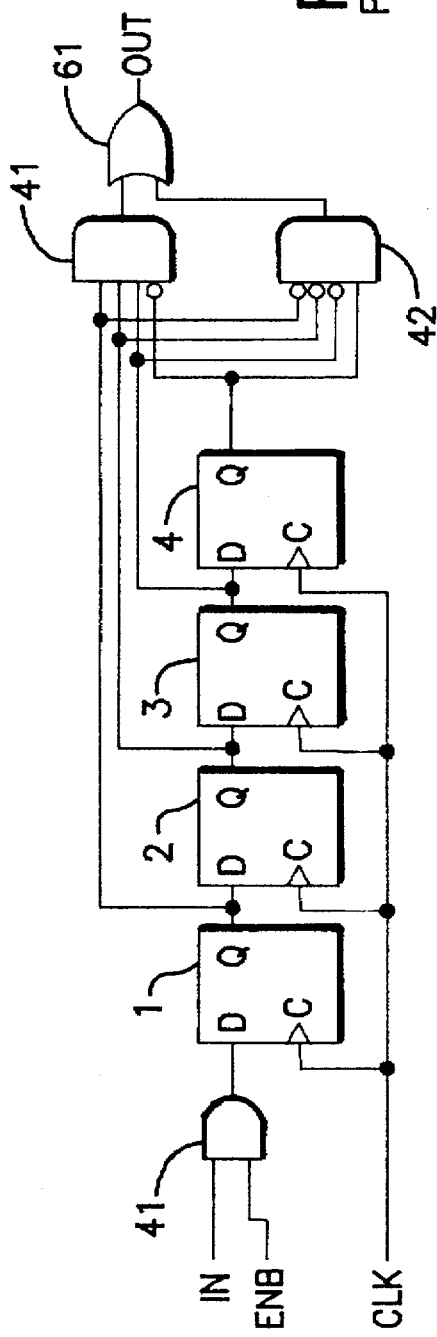
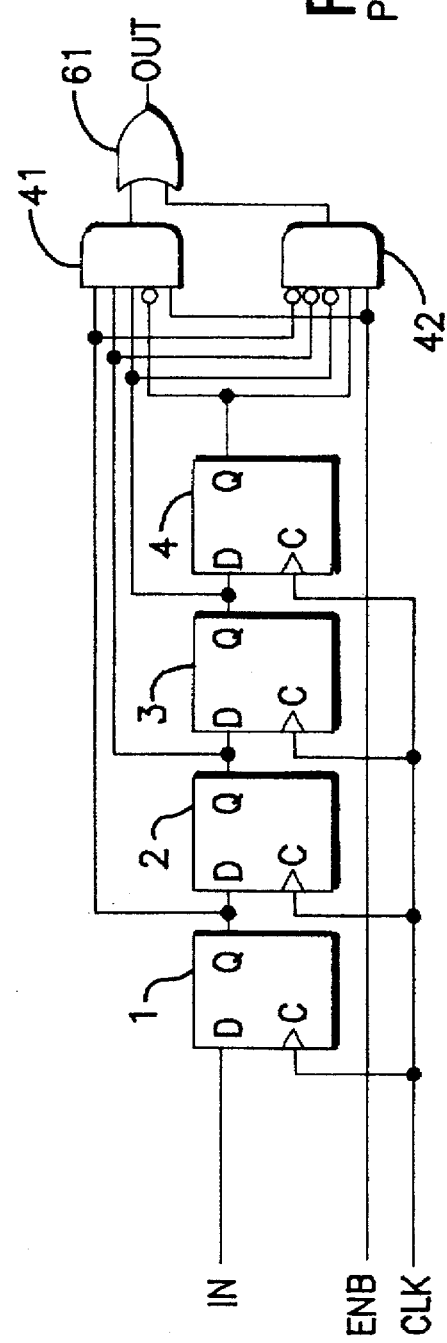

5,732,090

EDGE DETECTION CIRCUIT FOR DETECTING EDGE OF INPUT SIGNAL WITHOUT ERRONEOUS DETECTION

BACKGROUND OF THE INVENTION

1. Field of the Invention

The present invention relates to an edge detection circuit for detecting a leading or trailing edge of an input signal, and more particularly an edge detection circuit for detecting a leading or trailing edge of a signal without erroneous detection.

2. Description of the Related Art

In a microcomputer, there are many edge detection circuits for detecting an edge change of input signal, anywhere. An example of the conventional edge detection circuit is shown in FIG. 5. This circuit comprises D-flip flips (referred to as D-FFs hereinafter) 1–4, AND circuits 41–43 and an OR circuit 61. First, an input signal IN and an edge detection signal EN are input to the AND circuit 43, and signals are output sequentially from D-FFs 1–4 synchronized with a clock CLK. The outputs of the D-FFs 1–3 and the inverted output of the D-FF are input to the AND circuit 41, and the inverted outputs of the D-FFs 1–3 and the output of the D-FF 4 are input to the AND circuit 42. The edge detection control signal EN is a signal synchronized with the clock, and represents an edge detection state when it is at 1, and a no edge detection state when it is at 0.

If the input signal IN changes from 0 to 1 while the edge detection control signal EN is 111, the outputs of the D-FFs 1–4 also go sequentially from 0 to 1, and when the output of the D-FF 4 is 0, it is detected as a leading edge.

FIG. 6 is a timing chart showing the operation when the edge detection control signal EN of the edge detection circuit in FIG. 5 is varied. If the edge detection control signal EN changes from 0 to 1 while the input signal IN is 1, the outputs of the D-FFs 1–4 change sequentially from 0 to 1 synchronized with a leading edge of the clock CLK. If the outputs of the D-FFs 1–3 are 1 and the output of the D-FF 4 is 0, then the output of the AND circuit 41, namely, a leading edge detection signal goes to 1.

Next, if the edge detection signal EN changes from 1 to 0, the outputs of the D-FFs 1–4 change sequentially from 1 to 0 synchronized with the leading edge of the clock CLK. If the outputs of the D-FFs 1–3 are 0 and the outputs of the D-FF 4 is 1, then the output of the AND circuit 42, namely, a trailing edge detection signal goes to 1.

An example of configuration of the edge detection circuit constituted so as to avoid erroneous detection of a change in the edge detection control signal as an edge of the input signal is shown in FIG. 7. This circuit comprises D-FFs 1–4, AND circuit 41 and 42 and an OR circuit 61. The input signal IN is output sequentially from the D-FFs 1–4 synchronized with the clock CLK. The outputs of the D-FFs 1–3, the inverted outputs of the D-FF 4 and the edge detection control signal EN are input to the AND circuit 41 for detecting the leading edge of the input signal IN, and the inverted outputs of the D-FFs 1–3, the output of the D-FF 4 and the edge detection control signal EN are input to the AND circuit 42 for detecting the trailing edge of the input signal IN.

FIG. 8 is a timing chart showing the edge detection operation of the edge detection circuit shown in FIG. 7. When the edge detection control signal EN is 1, namely, the system is in the edge detection state, the input signal IN changes from 0 to 1. When the outputs of the D-FFs 1–3 are 1, and the output of the D-FF 4 is 0, the output of the AND circuit 41, namely, the leading edge detection signal goes to 1.

Next, as the input signal IN changes from 1 to 0, the outputs of the D-FFs 1–4 change sequentially from 1 to 0 synchronized with the leading edge of the clock CLK, however since the edge detection control signal EN is 0, namely, the system is in the no edge detection state when the outputs of the D-FFs 1–3 are 0 and the output of the D-FF 4 is 1, the output of the AND circuit 42, namely, the trailing edge detection signal will not go to 1.

However, in these conventional circuits, there occur cases in which noise is output to an edge detection signal OUT if the edge detection control signal EN is switched when the edge detection signal OUT goes to 1.

The timing chart in this situation is shown in FIG. 9. When the input signal IN goes from 0 to 1 and the output of the D-FF 4 goes to 1, if the edge detection control signal EN changes from 0 to 1, noise is output to the edge detection signal OUT in the event that the output of the D-FF 4 is input to the AND circuits 41 and 42 later than the edge detection control signal EN, for example, a delay of a clock supply line of the edge detection control signal EN which is not synchronized with the clock CLK.

Moreover, if the edge detection control signal EN changes from 1 to 0 when the input signal IN goes from 1 to 0 and the output of the D-FF 3 goes to 0, noise will also be output to the edge detection signal OUT in the event that the edge detection control signal EN is input to the AND circuits 41 and 42 later than the output of the D-FF 3. Besides, a problem exists in that the power consumption is increased since the D-FFs are operated even in the no edge detection state.

As a technology similar to this example a circuit is disclosed in Japanese Patent laid-open Sho. 63-37710. This circuit employs a timer in place of a plurality of D-FFs and does not have the edge detection control signal in an external terminal, so that there is no problem of noise, however there is a problem in that the timer is operated during the no edge detection state and the power consumption is increased.

SUMMARY OF THE INVENTION

An object of the present invention is, therefore, to provide an edge detection circuit which is capable of suppressing the occurrence of an erroneous detection signal or noise even when the edge detection control signal is varied, and suppressing the power consumption through inhibition of the operation of the D-FFs in the no edge detection state, by setting or resetting the D-FFs which receive the input signal according to the edge detection control signal.

To achieve the above object, the edge detection circuit of the present invention comprises an input terminal supplying an input signal, a clock terminal supplying a clock signal, a control terminal supplying a control signal, an output terminal, a first circuit having a first input node connected to the input terminal, a first clock node connected to the clock terminal, a first output node and a first reset node for resetting the first output node to a first level, the first circuit latching a level of the input signal in response to a first edge of the clock signal and outputting the latched level to the first output node, a second circuit having a second input node connected to the first output node of the first circuit, a second clock node connected to the clock terminal, and the second output terminal, the second circuit latching the level of the first output node in response to the first edge of the clock signal and outputting the latched level to the second output node, a third circuit having a third input node connected to the second output node, a third output node, a third clock node connected to the clock terminal, and a set node for setting the third output node to a second level, the third circuit latching the level of the second output node in response to the first edge of the clock signal and outputting the latched level to the third output node, a fourth circuit having a fourth input node connected to the third output node, a fourth output node, a fourth clock node connected to the clock terminal, a second set node for resetting the fourth output node to the second level, and a second reset node for setting the fourth output node to the first level, the fourth circuit latching the level of the third output node in response to the first edge of the clock signal and outputting the latched level to the fourth output node, a gate circuit connected to the first, second, third and fourth output node detecting an output of the fourth node being different from each of outputs of the first, second and third node and outputting an edge detection signal to the output terminal, a detection circuit detecting a change of the control signal, outputting a detection signal in response to the clock signal when the control signal changes an inactive level to an active level, and outputting the inactive level to the first reset node for resetting the first output node to the first level during the control signal is at the inactive level, a control circuit receiving the signal of the first output node, the detection signal in response to an inversion clock signal of the clock signal, and outputting a set signal to the first and second set nodes when the detection signal indicates the control signal changing the inactive level to the active level and the input signal indicates the second level.

Thus, the edge detection circuit according to the present invention has the effect of suppressing the generation of an erroneous detection signal or noise even when the edge detection control signal is varied, and suppress the power consumption by inhibiting the operation of the D-FFs in the no edge detection state.

BRIEF DESCRIPTION OF THE DRAWINGS

The above and other objects, feature and advantages of the present invention will be more apparent from the following description taken in conjunction with the accompanying drawings, in which:

FIG. 5 shows a circuit diagram of the conventional edge detection circuit;

FIG. 7 shows a circuit diagram of the conventional edge detection circuit;

DETAILED DESCRIPTION OF THE PREFERRED EMBODIMENTS

Figure 1:
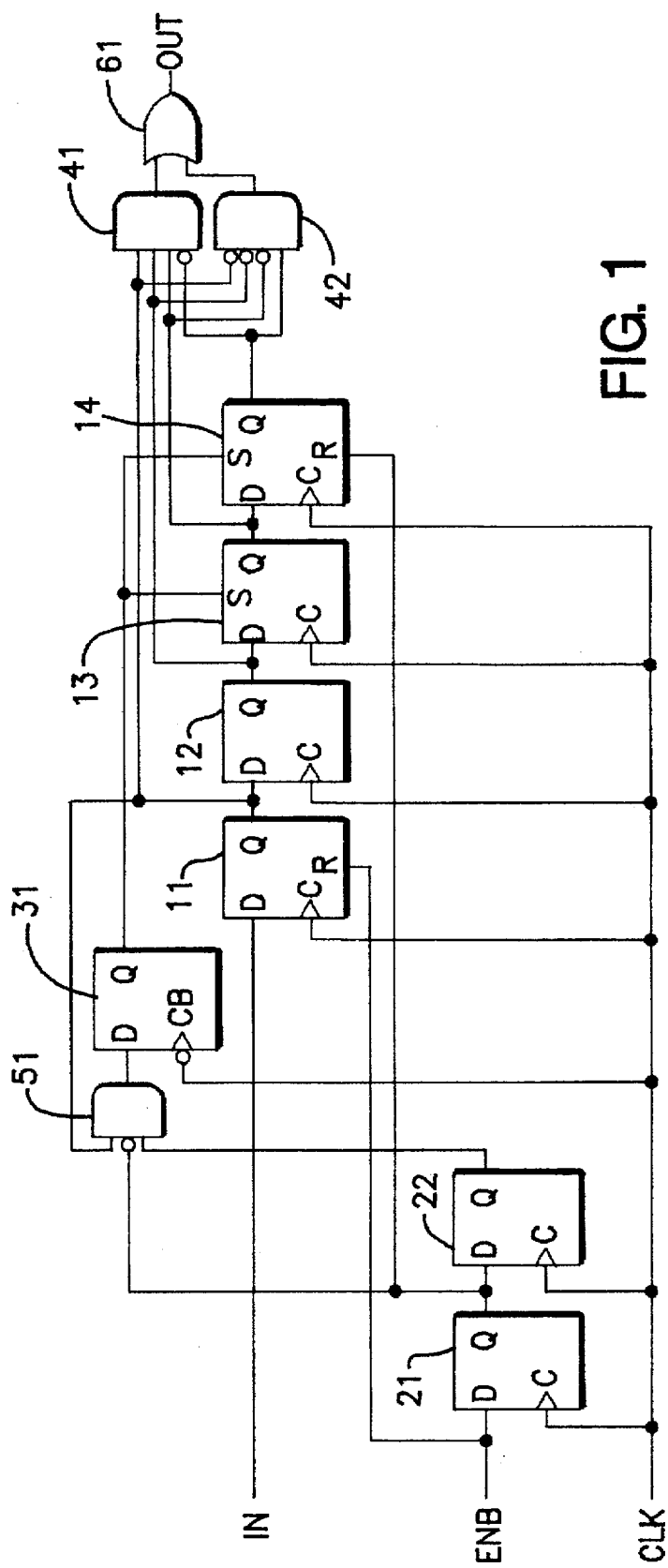
FIG. 1 shows a circuit diagram of the first embodiment of the edge detection circuit of the invention.

Referring to the drawings, the embodiments of this invention will be described. A circuit diagram of a first embodiment of the edge detection circuit according to this invention is shown in FIG. 1. This edge detection circuit comprises D-FFs 11–14, 21, 22 and 31, AND circuits 41, 42 and 51, and an OR circuit 61. The D-FFs 11–14, 21 and 22 are operated synchronized with a leading edge of a clock CLK, the D-FF 31 is operated synchronized with a trailing edge of the clock CLK, and the D-FF 11 is a FF with a reset terminal, the D-FF 13 is a FF with a set terminal and the D-FF 14 is a FF with a set and reset terminals.

The D-FFs 11–14 receive the input signal IN, the AND circuit 41 receives the outputs of the D-FFs 11–13 and the inverted output of the D-FF 14 as inputs, and the AND circuit 42 receives the inverted outputs of the D-FFs 11–13 and the output of the D-FF as inputs. The D-FFs 21 and 22 receive a edge detection control signal ENB, the AND circuit 51 receives the outputs of the D-FFs 21 and 22 and the inverted output of the D-FF 21 as inputs, and the D-FF 31 receives the output of the AND circuit 51 as an input. Further, the edge detection signal ENB is input to the reset terminal of the D-FF 11, the output of the D-FF 21 is input to the reset terminal of the D-FF 14, and input the output of the D-FF 31 to the set terminals of the D-FFs 13 and 14. In this case, the edge detection control signal ENB is a signal synchronized with the clock CLK, and it is a signal which shows an edge detection state when it is a Lo level (0) and a no edge detection state when it is a Hi level (1).

As the edge detection control signal ENB goes to 1 the D-FF 11 is reset synchronized with the leading edge of the clock CLK, and the D-FF 14 is reset synchronized with the leading edge of the next clock CLK. When the output of the D-FF is 1, the trailing edge of the edge detection control signal ENB is detected by the D-FFs 21 and 22 and the AND circuit 51, and the output of the D-FF 31 goes to 1 at the trailing edge of the clock CLK and sets the D-FFs 13 and 14.

Figure 2:
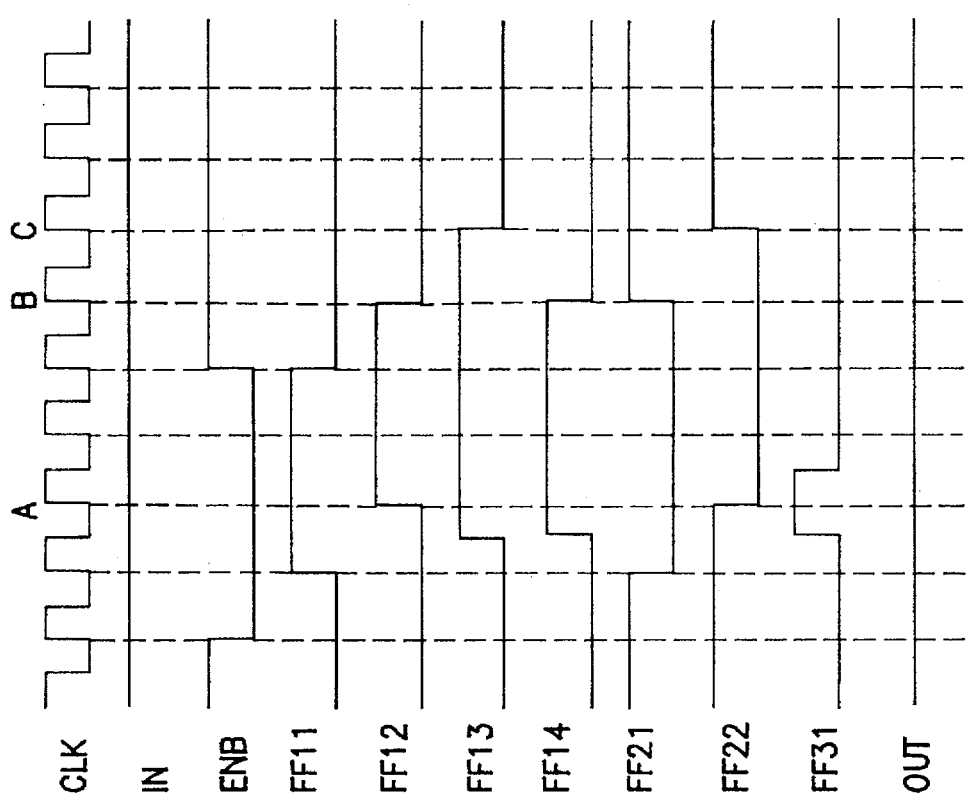
FIG. 2 shows a timing chart of the edge detection circuit of the invention shown in FIG. 1.

A timing chart when the edge detection control signal ENB is varied while the input signal IN of the edge detection circuit in FIG. 1 is 1 is shown in FIG. 2. If the edge detection control signal ENB goes from 1 to 0, namely, goes to the edge detection state while the input signal IN is 1, the output of the D-FF 21 goes to 0 and the output of the D-FF 22 goes to 1 in response to the first leading edge of the clock CLK and the output of the AND circuit 23 goes to 1. Half clock after that the output of the D-FF 31 goes to 1, which sets the D-FFs 13 and 14. At the next leading edge A of the clock CLK, the output of the D-FF 12 goes to 1. In order to prevent, as a result of this, the system from going to the leading edge detection due to the switching to the edge detection state, it is possible to change the outputs of the D-FFs 11–14 to 1.

In addition, when the edge detection control signal ENB goes from 0 to 1, namely, to the no edge detection state, first, the D-FF 11 is reset by the edge detection control signal ENB, the output of the D-FF 12 goes to 0 and the output of the D-FF 21 goes to 1 at the leading edge B of the clock CLK, and the D-FF 14 is reset by the output of the D-FF 21. The output of the D-FF 13 goes to 0 at the next leading edge C of the clock CLK. In this way, it is possible to change the outputs of the D-FFs 11–14 to 0 in order to prevent the system from detecting the trailing edge of the edge detection control signal ENB when it is switched to the no edge detection state.

Figure 3:
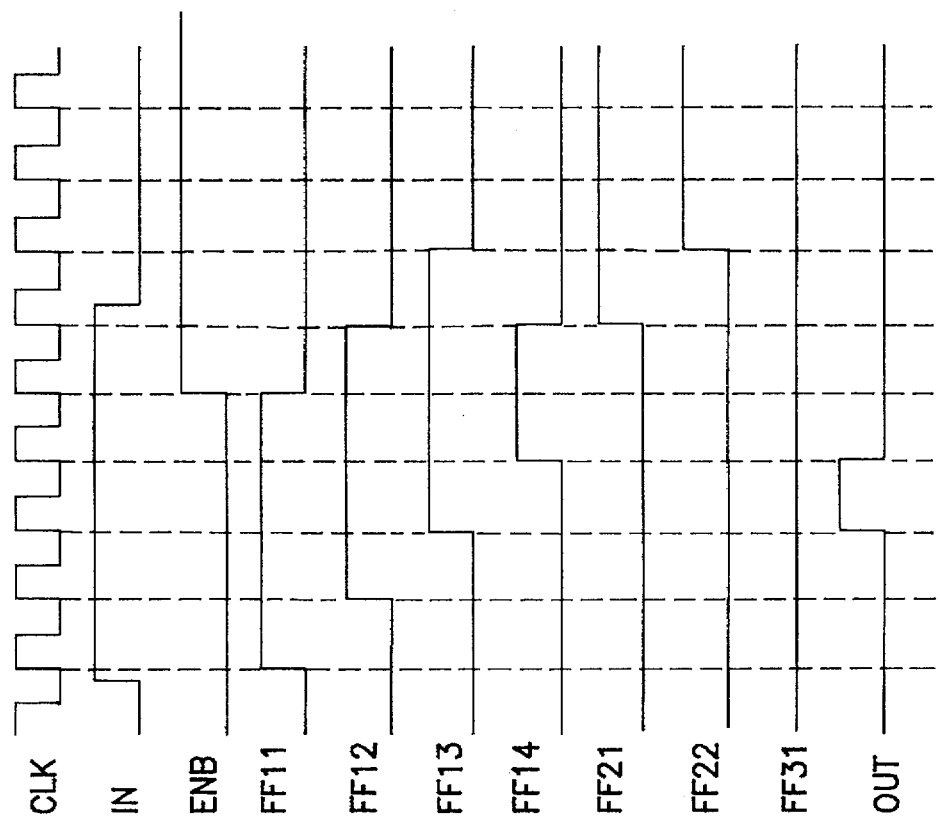
FIG. 3 shows a timing chart of the edge detection circuit of the invention shown in FIG. 1.

A timing chart showing the edge detection operation of the edge detection circuit in FIG. 1 is shown in FIG. 3. If the input signal IN changes from 0 to 1 while the edge detection control signal ENB is 0, the outputs of the D-FFs 11–14 go sequentially from 0 to 1 at the leading edge of the clock CLK. When the output of the D-FFs 11–13 are 1 and the output of the D-FF 14 is 0, the output of the AND circuit 41, that is, the leading edge detection signal goes to 1.

Next, even if the input signal IN changes from 1 to 0 while the edge detection control signal ENB is 1, the D-FFs 11–14 do not change each output since the outputs of the D-FFs 11–14 are already 0, and the output of the AND circuit 42, that is, the trailing edge detection signal will not go to 1. If the edge detection control signal ENB is 0, the trailing edge detection signal goes to 1 analogous to the leading edge detection signal. Accordingly, when the edge detection control signal ENB is 1, the D-FFs 11–14 will not change each output the input signal IN changes, so that it is possible to reduce the power consumption of the D-FFs.

In this embodiment, the D-FF 12 does not have a set terminal, however, it is able to modify the D-FF 12 having the set terminal receiving the signal from D-FF 31 same as D-FF 13. However, in the modification case, a circuit size of the D-FF 12 becomes large.

Figure 4:
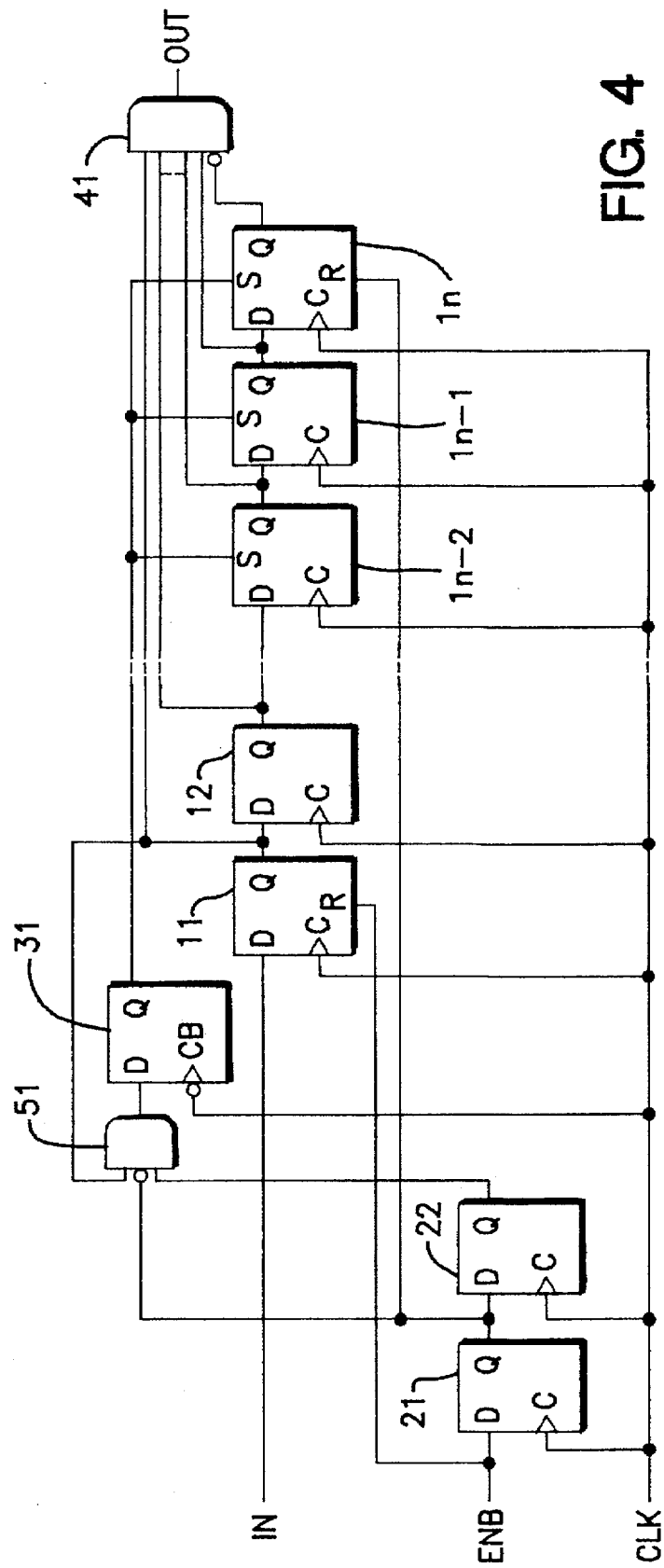
FIG. 4 shows a circuit diagram of the second embodiment of the edge detection circuit of the invention.
Figure 6:
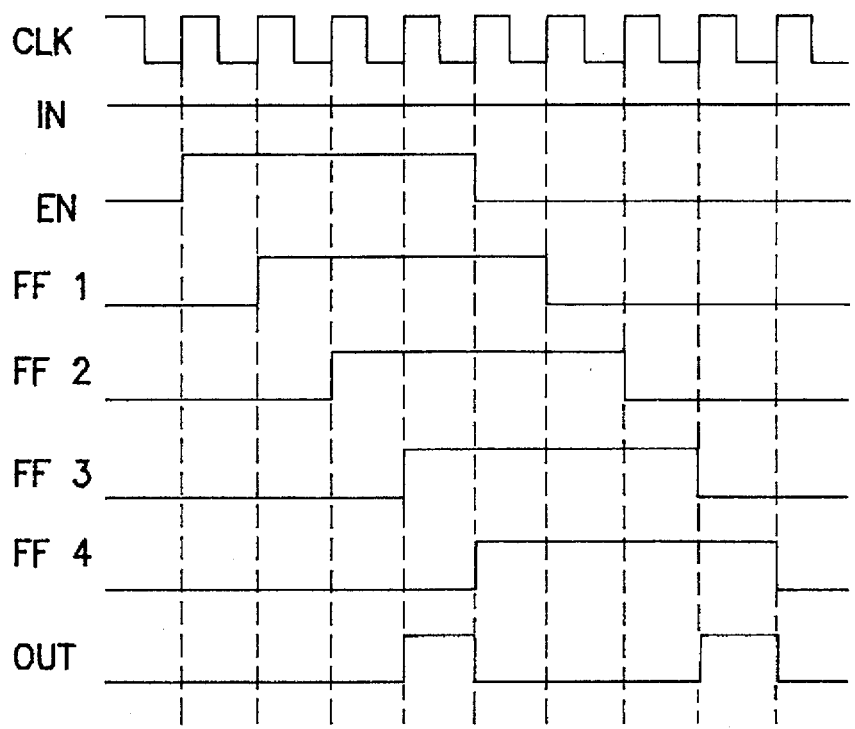
FIG. 6 shows a timing chart of the conventional edge detection circuit shown in FIG. 5.
Figure 8:
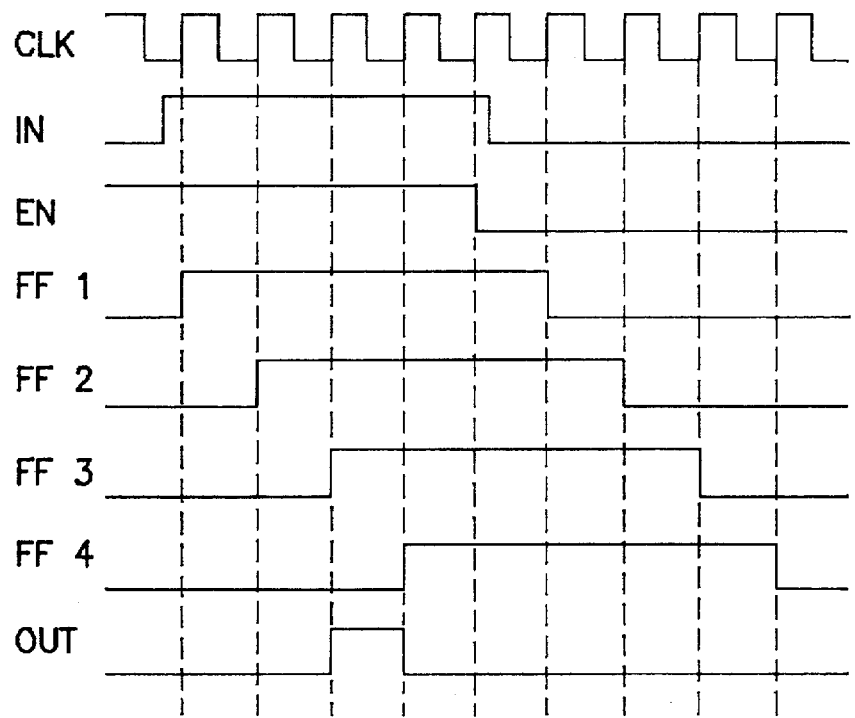
FIG. 8 shows a timing chart of the conventional edge detection circuit shown in FIG. 7.
Figure 9:
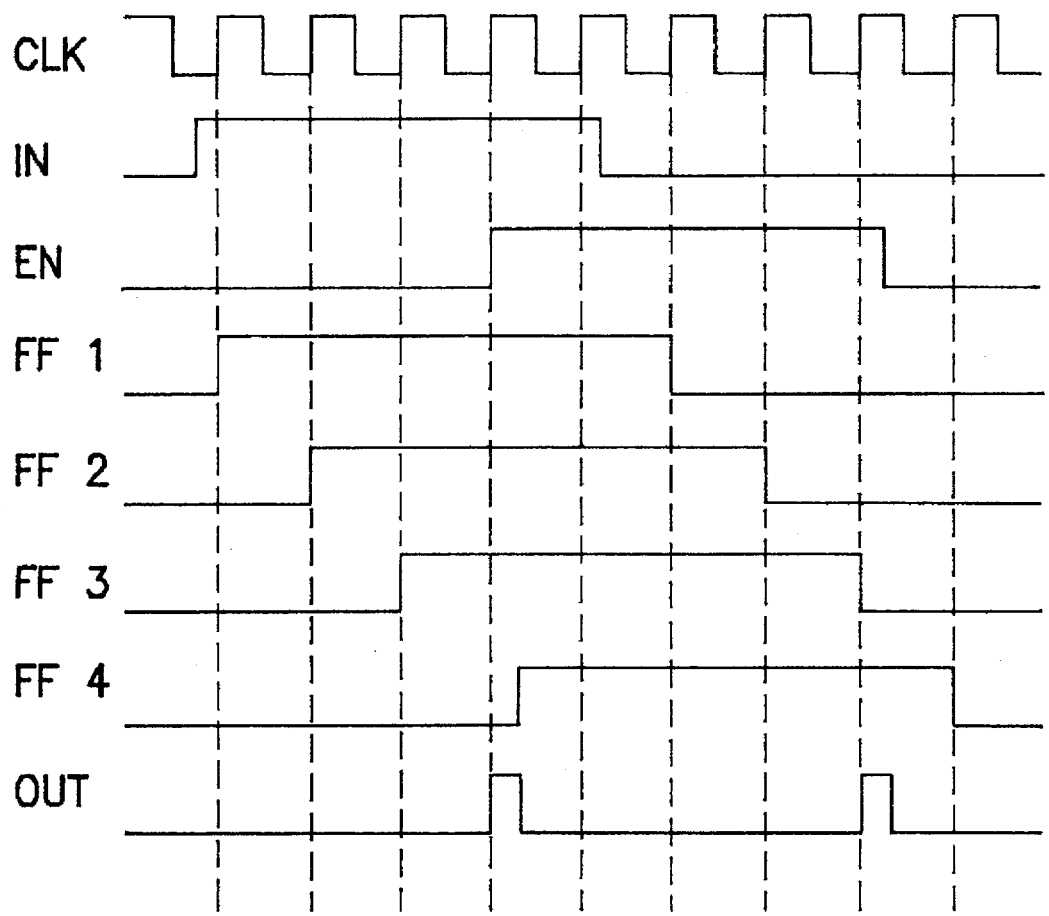
FIG. 9 shows a timing chart of the conventional edge detection circuit shown in FIG. 7.

A circuit diagram showing a second embodiment of the edge detection circuit according to this invention is shown in FIG. 4. The difference in the configuration of this edge detection circuit form that the circuit in FIG. 1 resides in the fact that the number of the D-FFs that receive the input signal is increased from 4 to n, and that the AND circuit 42 for detecting the trailing edge and the OR circuit are deleted. Each of the D-FFs 13–1n, except for the D-FF 11 and 12, has set terminal, and each of the set terminal receive the signal from D-FF 31 in common. The operation of this embodiment is the same as that of the first embodiment, and, the width of the acceptable input signal IN is increased to more than n−1 clocks.

In the embodiment modes in the above, the leading edge alone is detected, however this invention can also be applied to the case of detecting the trailing edge alone of the case of detecting both edges.

As described in the above, the edge detection circuit according to this invention has the effect of suppressing the generation of an erroneous detection signal or noise even when the edge detection control signal is varied, and suppress the power consumption by inhibiting the operation of the D-FFs in the no edge detection state.

Moreover, the edge detection circuit according to this invention is effective to the cases where two or more functions are assigned to the input signal. For example, when the interrupt signal and the input data signal are shared, effect similar to the above can be obtained by setting the system to the edge detection state when used as an interrupt signal, and setting the system to the no edge detection state when used as an input data signal.

It is apparent that the above specific embodiments is not meant to be construed in limiting sense of the present invention. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A circuit comprising:
   an input terminal receiving an input signal;
   a clock terminal receiving a clock signal;
   a control terminal reveiving a control signal;
   an output terminal;
   a first circuit having a first input node connected to said input terminal, a first clock node connected to said clock terminal, a first output node and a first reset node for resetting said first output node to a first level, said first circuit latching a level of said input signal in response to a first edge of said clock signal and outputting said latched level to said first output node;
   a second circuit having a second input node connected to said first output node of said first circuit, a second clock node connected to said clock terminal, and second output terminal, said second circuit latching said level of said first output node in response to said first edge of said clock signal and outputting said latched level to said second output node;
   a third circuit having a third input node connected to said second output node, a third output node, a third clock node connected to said clock terminal, and a first set node for setting said third output node to a second level, said third circuit latching said level of said second output node in response to said first edge of said clock signal and outputting said latched level to said third output node;
   a fourth circuit having a fourth input node connected to said third output node, a fourth output node, a fourth clock node connected to said clock terminal, a second set node for resetting said fourth output node to said second level, and a second reset node for setting fourth output node to said first level, said fourth circuit latching said level of said third output node in response to said first edge of said clock signal and outputting said latched level to said fourth output node;
   a gate circuit connected to said first, second, third and fourth output node detecting an output of said fourth node being different from each of outputs of said first, second and third node and outputting an edge detection signal to said output terminal;
   a detection circuit detecting a charge of said control signal, outputting a detection signal in response to said clock signal when said control signal changes an inactive level to an active level, and outputting said inactive level to said first reset node for resetting said first output node to said first level during said control signal is at said inactive level; and
   a control circuit receiving said signal of said first output node, said detection signal in response to an inversion clock signal of said clock signal, and outputting a set signal to said first and second set nodes when said detection signal indicates said control signal changing said inactive level to said active level and said input signal indicates said second level.

2. The circuit as claimed in claim 1, wherein said gate circuit has a first AND gate receiving outputs of said first, second and third nodes and an inversion output of said fourth node for outputting said edge detection signal indicating said input signal being changed said first level to said second level, and a second AND gate receiving inversion outputs of said first, second, and third nodes and said output of said fourth node for outputting said edge detection signal indicating said input signal being changed said second level to said first level.

3. The circuit as claimed in claim 1, wherein said detection circuit has a fifth circuit having a fifth input node connected to said control terminal, a fifth clock node connected to said clock terminal, and a fifth output node, and a sixth circuit having a sixth input node connected to said fifth node, a sixth clock node connected to said clock terminal, and a sixth output node.

4. The circuit as claimed in claim 3, wherein said control circuit has a third AND gate receiving an inversion level of said fifth node, a level of said sixth node, and said level of said first node, and a seventh circuit having a seventh input node receiving an output of said third AND gate, a seventh clock node receiving said inversion clock signal, and a seventh output node connected to said first and second set terminal.

* * * * *